United States Patent
Liu et al.

(10) Patent No.: US 11,561,633 B2
(45) Date of Patent: Jan. 24, 2023

(54) DISPLAY PANEL AND METHOD FOR MANUFACTURING THE SAME, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Wei Liu, Beijing (CN); Chengchung Yang, Beijing (CN); Xiangfei He, Beijing (CN); Bo Yang, Beijing (CN); Chuanyong Li, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/214,381

(22) Filed: Mar. 26, 2021

(65) Prior Publication Data
US 2022/0019304 A1    Jan. 20, 2022

(30) Foreign Application Priority Data

Jul. 20, 2020 (CN) .......................... 202010697451.0

(51) Int. Cl.
G06F 3/041 (2006.01)
H01L 27/32 (2006.01)
H01L 51/56 (2006.01)

(52) U.S. Cl.
CPC ........ *G06F 3/0412* (2013.01); *G06F 3/04164* (2019.05); *H01L 27/323* (2013.01); *H01L 51/56* (2013.01); *G06F 2203/04103* (2013.01)

(58) Field of Classification Search
None
See application file for complete search history.

(56) References Cited

U.S. PATENT DOCUMENTS 11,018,165 B2 * 5/2021 Yan ........................ G06F 3/0412

\* cited by examiner

*Primary Examiner* — Brian M Butcher
(74) *Attorney, Agent, or Firm* — Brooks Kushman P.C.

(57) ABSTRACT

A display panel includes: an active area; a peripheral area; a solder pad area at a side of the peripheral area away from the active area; a first source-drain electrode layer, a passivation layer and a second source-drain electrode layer and a dielectric layer stacked on a back plate in the peripheral area; a touch electrode in the active area; a touch electrode line connected to the touch electrode. The touch electrode line extends from the active area to the peripheral area, and is connected to the solder pad area through the second source-drain electrode layer in the peripheral area. The touch electrode line is connected to the second source-drain electrode layer through a first through hole in the dielectric layer. A portion of a surface of the second source-drain electrode layer, which is away from the passivation layer and exposed through the first through hole, is a flat surface.

14 Claims, 7 Drawing Sheets

--Prior Art--

--Prior Art--

--Prior Art--

DISPLAY PANEL AND METHOD FOR MANUFACTURING THE SAME, AND DISPLAY DEVICE

CROSS-REFERENCE TO RELATED APPLICATION

This application claims priority to Chinese Patent Application No. 202010697451.0 filed on Jul. 20, 2020, which is incorporated herein by reference in its entirety.

TECHNICAL FIELD

The present disclosure relates to the field of display technology, in particular to a display panel, a method for manufacturing the display panel and a display device.

BACKGROUND

An Active Matrix/Organic Light Emitting Diode (AMO-LED) relates to a display panel technology based on Organic Light Emitting Diodes (OLEDs). Compared with a Thin Film Transistor-Liquid Crystal Display (TFT-LCD) technology, the AMOLED has characteristics of faster response speed, higher contrast, wider viewing angle, and low power consumption.

Currently, there are more and more touch display products on the market. In a Flexible Multiple Layer On Cell (FM-LOC) product, a touch function is directly integrated on a display panel, which is conducive to lightness and thinness of a whole machine. In order to achieve a narrow frame of a product, it is a popular technology to set a solder pad area of the display panel on a back of an active area and connect them through a bent wiring. When the FMLOC is integrated on such product, a touch electrode line needs to be connected through a source/drain electrode layer in a peripheral area. In the foregoing display panel structure in the related art, the touch electrode line is easily broken when the wiring is bent, which seriously affects a yield of touch display products.

SUMMARY

A display panel is provided in an embodiment of the present disclosure, including: an active area; a peripheral area surrounding the active area; a solder pad area at a side of the peripheral area away from the active area; a back plate; a first source-drain electrode layer, a passivation layer and a second source-drain electrode layer and a dielectric layer sequentially stacked on the back plate and located in the peripheral area; a touch electrode in the active area; and a touch electrode line electrically connected to the touch electrode. The touch electrode line extends from the active area to the peripheral area, and is connected to the solder pad area through the second source-drain electrode layer in the peripheral area. The touch electrode line is connected to the second source-drain electrode layer through a first through hole in the dielectric layer; and a portion of a surface of the second source-drain electrode layer, which is away from the passivation layer and exposed through the first through hole, is a flat surface.

Further, a second through hole is defined in the passivation layer; the second source-drain electrode layer is connected to the first source-drain electrode layer through the second through hole; a position of the first through hole in the dielectric layer is corresponding to a position of the second through hole.

Further, the dielectric layer extends to a side wall that defines the first through hole, and is in contact with a lateral surface of the second source-drain electrode layer away from the passivation layer.

Further, the display panel further includes: a planarization layer between the dielectric layer and the back plate. A third through hole is defined in the planarization layer at a position corresponding to the position of the second through hole. The planarization layer extends to a side wall that defines the third through hole and is in contact with the surface of the second source-drain electrode layer away from the passivation layer. The touch electrode line extends through the first through hole and the third through hole and is in contact with the second source-drain electrode layer.

Further, the display panel further includes a first flattening layer and a second flattening layer between the back plate and the first source-drain electrode layer. A vertical distance between the back plate and a surface of the first flattening layer away from the back plate is equal to a vertical distance between the back plate and a surface of the second flattening layer away from the back plate. The first source-drain electrode layer forms a first protrusion at a position corresponding to the first flattening layer and a second protrusion at a position corresponding to the second flattening layer. A fourth through hole and a fifth through hole are defined in the passivation layer; the first protrusion extends through the fourth through hole; the second protrusion extends through the fifth through hole. A vertical distance between a surface of the passivation layer away from the back plate and the first source-drain electrode layer is equal to the vertical distance between the back plate and the surface of the first flattening layer away from the back plate. The second source-drain electrode layer is in contact with the first protrusion and the second protrusion.

Further, the display panel further includes: a planarization layer between the dielectric layer and the back plate. A sixth through hole is defined in the planarization layer at a position corresponding to a position of the first through hole; and the touch electrode line is connected to the second source-drain electrode layer through the first through hole as well as the sixth through hole.

Further, the second source-drain electrode layer is in direct contact with the first protrusion and the second protrusion.

A display device is further provided in an embodiment of the present disclosure, including the above-mentioned display panel.

A method for manufacturing a display panel is further provided in an embodiment of the present disclosure, including:

forming an active area, a peripheral area and a solder pad area on a back plate; wherein the peripheral area surrounds the active area and the solder pad area is located at a side of the peripheral area away from the active area;

sequentially fabricating a first source-drain electrode layer, a passivation layer, a second source-drain electrode layer and a dielectric layer on the back plate in the peripheral area, and etching a first through hole in the dielectric layer; wherein a portion of a surface of the second source-drain electrode layer, which is away from the passivation layer and exposed through the first through hole, is a flat surface; and forming a touch electrode and a touch electrode line in the active area; wherein the touch electrode line is electrically connected to the touch electrode, the touch electrode line extends from the active area to the peripheral area and is connected to the solder pad area through the second source-drain electrode layer in the peripheral area, and the touch electrode line is connected to the second source-drain electrode layer through the first through hole.

Further, before fabricating the second source-drain electrode layer, the method further includes: etching the passivation layer to form a second through hole.

Further, before fabricating the first source-drain electrode layer, the method further includes: forming a first flattening layer and a second flattening layer on the back plate. A vertical distance between the back plate and a surface of the first flattening layer away from the back plate is equal to a vertical distance between the back plate and a surface of the second flattening layer away from the back plate. When fabricating the passivation layer, the method further includes: etching the passivation layer to form a fourth through hole and a fifth through hole. The first protrusion extends through the fourth through hole; the second protrusion extends through the fifth through hole; a vertical distance between a surface of the passivation layer away from the back plate and the first source-drain electrode layer is equal to the vertical distance between the back plate and the surface of the first flattening layer away from the back plate.

BRIEF DESCRIPTION OF THE DRAWINGS

To better clarify technical solutions of embodiments of the present disclosure or the related art, drawings used in description of the embodiments or the related art are briefly introduced hereinafter. Apparently, the described drawings merely illustrate a part of the disclosed embodiments. A person of ordinary skill in the art can obtain other drawings based on the described drawings without any creative efforts.

Figure 1:
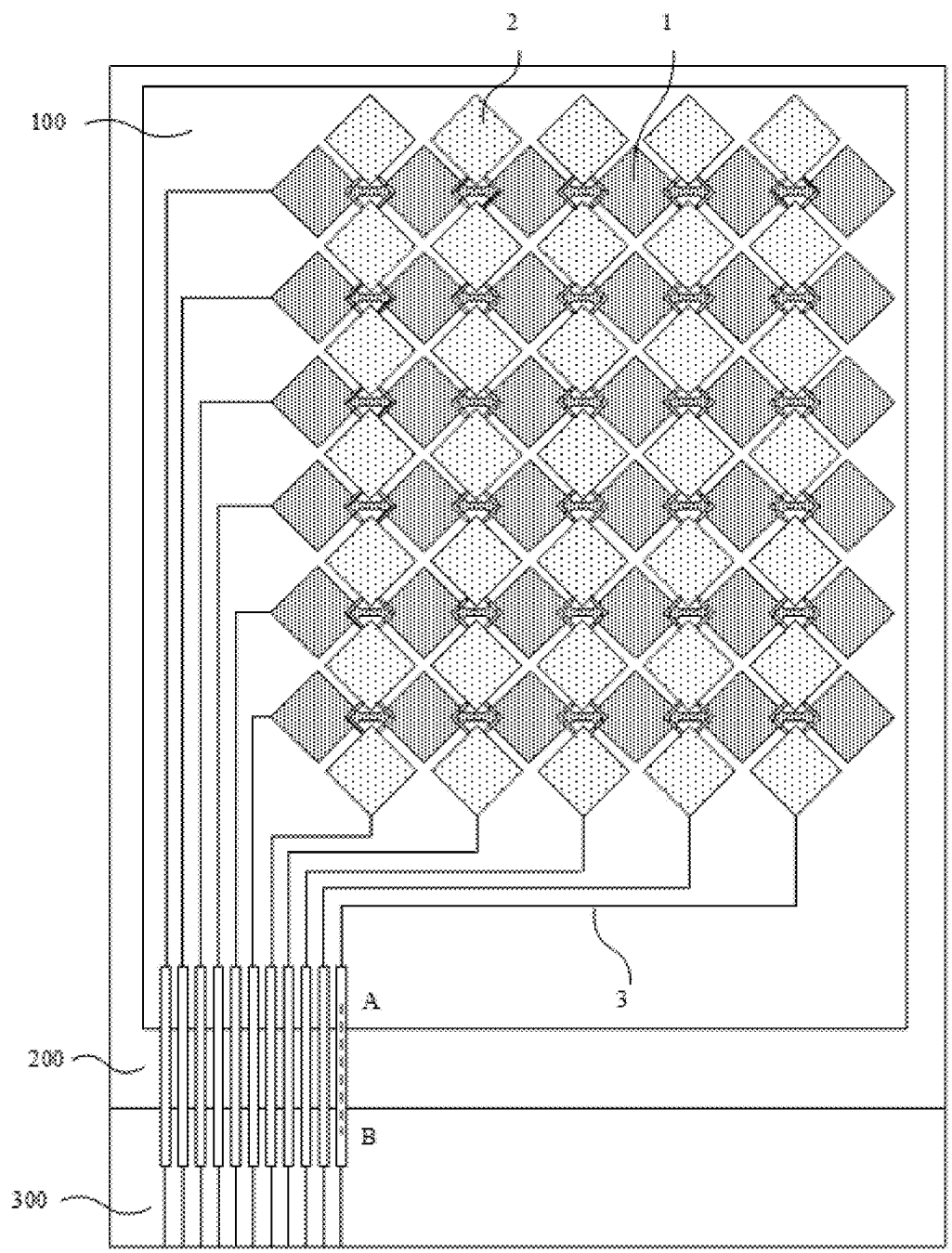
FIG. 1 shows a schematic diagram of wirings of a display panel in the related art.

| Reference numerals: | |
|---|---|
| 1-first touch electrode | 2-second touch electrode |
| 3-touch electrode line | 10-back plate |
| 20-first source-drain electrode layer | 30-passivation layer |
| 31-second through hole | 32-fourth through hole |
| 33-fifth through hole | 40-second source-drain electrode layer |
| 50-dielectric layer | 51-first through hole |
| 60-planarization layer | 61-third through hole |
| 62-sixth through hole | 70-flattening layer |
| 71-first flattening layer | 72-second flattening layer |
| 100-active area | 200-peripheral area |
| 300-solder pad area | |

DETAILED DESCRIPTION

Various solutions and features of the present disclosure are described hereinafter with reference to the drawings.

It should be appreciated that various modifications may be made to the embodiments of the present disclosure. Therefore, the specification should not be regarded as a limitation, but merely as an example of an embodiment. A person skilled in the art may make other modifications within the scope and spirit of the present disclosure.

The drawings included in the specification and constituting a part of the specification illustrate the embodiments of the present disclosure, and are used to explain the principle of the present disclosure together with the foregoing general description of the present disclosure and the detailed description of the embodiments described below.

These and other features of the present disclosure will become apparent from the following description of examples of the embodiments of the present disclosure with reference to the accompanying drawings.

It should further be understood that although the present disclosure has been described with reference to some specific examples, those skilled in the art can make other equivalent forms of the present disclosure, which have features as claimed and are therefore within the protection scope.

Combined with the drawings, the foregoing and other aspects, features and advantages of the present disclosure may become more apparent in view of the following detailed description.

Specific embodiments of the present disclosure may be described with reference to the drawings. However, it should be appreciated that the embodiments are merely examples of the present disclosure, which may be implemented in various ways. Well-known and/or repeated functions and structures have not been described in detail to avoid unnecessary or redundant details from obscuring the present disclosure. Therefore, the specific structural and functional details of the present disclosure are not used for limitation, but merely serve as the basis and representative basis of the claims to teach those skilled in the art to use the present disclosure in a variety of ways with any appropriate detailed structures.

The phrases "in one embodiment", "in another embodiment", "in yet another embodiment" or "in other embodiments" used in the specification may refer to one or more of the same or different embodiments according to the present disclosure.

Figure 2:
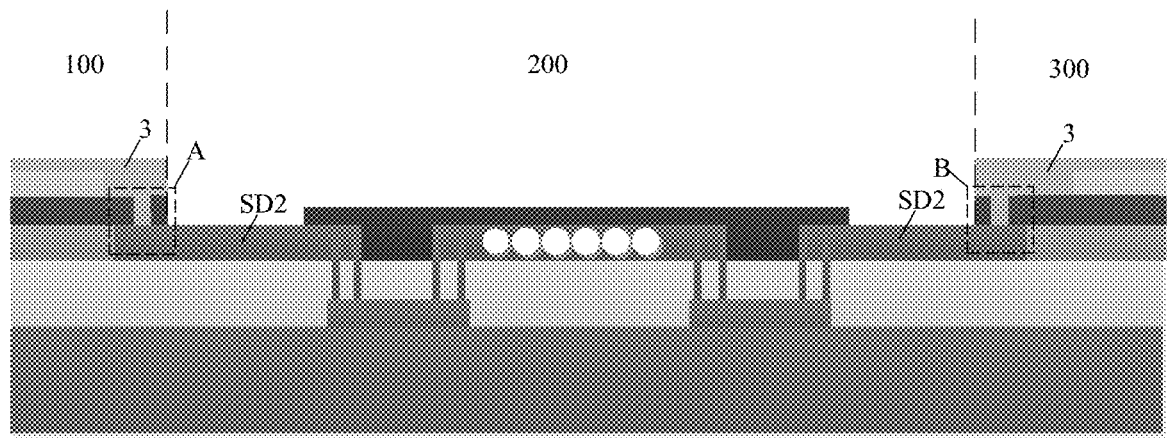
FIG. 2 shows a schematic cross-sectional view of the display panel taken along a line AB shown in FIG. 1.
Figure 3:
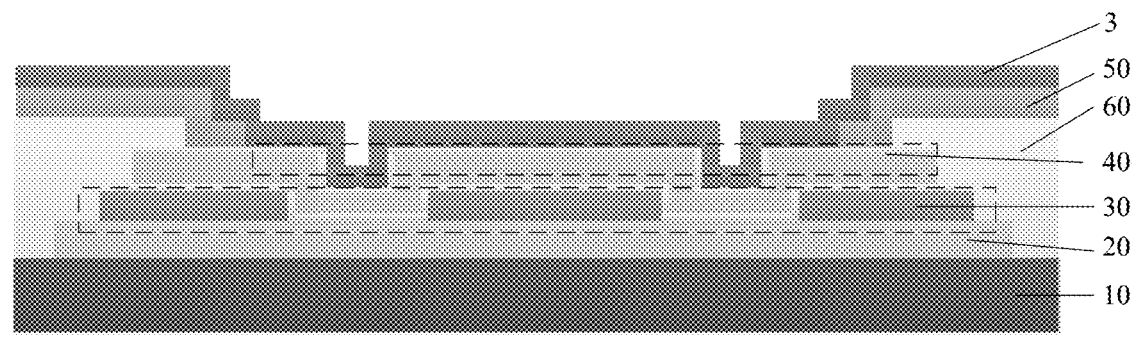
FIG. 3 shows a partial enlarged diagram of an end A shown in FIG. 2.

A main implementation of a FMLOC product is to form touch electrodes on a back plate (BP) of an active area 100. As shown in FIG. 1, the touch electrodes mainly include a first touch electrode 1 (also labeled as M1) and a second touch electrode 2 (also labeled as M2). The first touch electrode 1 and the second touch electrode 2 are connected through a via-hole in a dielectric layer. Touch electrode lines 3 are electrically connected to M1 and M2, respectively, to transmit touch signals. Specifically, the touch electrode line 3 extends from the active area 100 to a peripheral area 200, and is connected to a solder pad pin in a solder pad area 300 through a second source-drain electrode layer (SD2) in the peripheral area 200. FIG. 2 is a schematic cross-sectional view of the display panel taken along a dotted line AB shown in FIG. 1. As shown in FIG. 2, an end A is a part where the touch electrode line 3 in the active area 100 is connected to the SD2 in the peripheral area 200; and an end B is a part where the touch electrode line 3 in the solder pad area 300 is connected to the SD2 in the peripheral area 200. In this way, the touch electrode line 3 located at the end A and the touch electrode line 3 located at the end B are connected the SD2 in the peripheral area 200. FIG. 3 is a partial enlarged schematic diagram of the end A or end B in the related art. As can be seen from FIG. 3, when the touch electrode line 3 is connected to the SD2, due to the presence of a passivation layer (PVX) under the SD2, a surface of the SD2 in contact with a via-hole layer is not flat, which is easy to cause damage to the surface of SD2 when etching the via-hole layer (as shown in a dotted box in FIG. 3). After the touch electrode line 3 is formed, a part as shown in the dotted box in FIG. 3 is bent, which is easy to cause the touch electrode line to break, resulting in malfunction of a touch function, and then seriously affecting a yield of touch display products.

Figure 4:
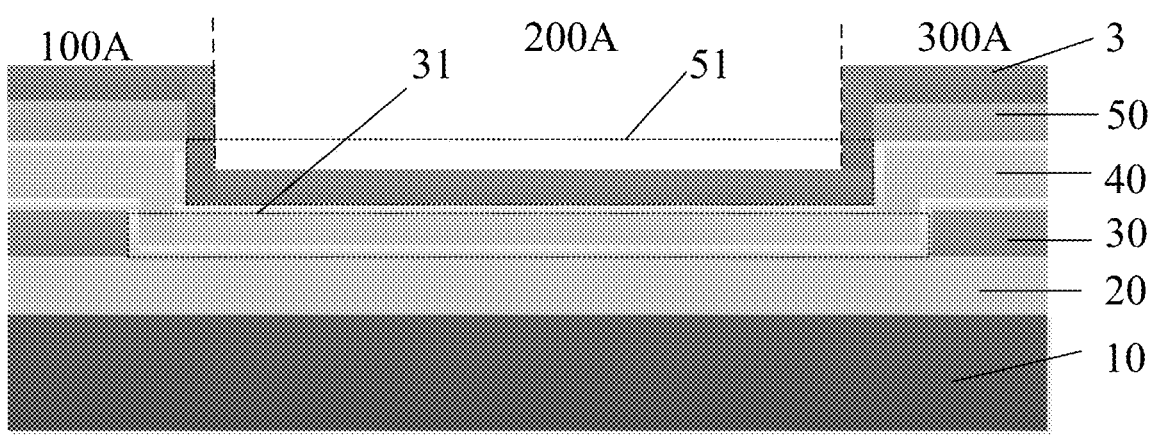
FIG. 4 shows a cross-sectional view of a first layered structure of a display panel in some embodiments of the present disclosure.

In order to solve the foregoing problem, a display panel is provided in some embodiments of the present disclosure. FIG. 4 shows a first cross-sectional schematic diagram of the display panel. The display panel mainly includes an active area 100A, a peripheral area 200A, and a solder pad area 300A. The peripheral area 200A surrounds the active area 100A. The solder pad area 300A is located at a side of the peripheral area 200A away from the active area 100A.

Touch electrodes are provided in the active area 100A. The touch electrodes are connected through touch electrode lines 3. The touch electrode line 3 extends from the active area 100A to the peripheral area 200A, and is connected to the solder pad area 300A through a second source-drain electrode layer 40 in the peripheral area 200A. Generally, in order to realize a narrow frame of a display screen, the solder pad area 300A may be provided on a back of the active area 100A, and wirings in the peripheral area 200A are bent to realize wiring connections.

As shown in FIG. 4, a first source-drain electrode layer 20 (also labeled as SD1), a passivation layer 30, a second source-drain electrode layer 40 and a dielectric layer 50 are sequentially provided on the back plate 10 and in the peripheral area 200A. A first through hole 51 is defined in the dielectric layer 50, so that the touch electrode line 3 is connected to the second source-drain electrode layer 40 through the first through hole 51. It should be noted that a portion of a surface (an upper surface of the second source-drain layer 40 when the display panel is in an orientation as shown in FIG. 4) of the second source-drain electrode layer 40, which is away from the passivation layer 30 and exposed through the first through hole 51, is a flat surface. That is, a portion of the second source-drain electrode layer 40 in contact with the touch electrode line 3 is a flat surface. By fabricating the dielectric layer 50 on the flat second source-drain electrode layer 40, it can avoid damage to the surface of the second source-drain electrode layer 40 to a greatest extent. Further, by fabricating the dielectric layer 50 on the flat second source-drain electrode layer 40, it can not only increase a contact area between the touch electrode line 3 and the second source-drain electrode layer 40 when fabricating the touch electrode line 3, and but also reduce a breaking risk of the touch electrode line 3 in a bendable region where the touch electrode line 3 is in contact with the second source-drain electrode layer 40, thereby improving a yield of touch display products.

Referring to FIG. 4, in order to achieve a flat upper surface of the second source-drain electrode layer 40 and achieve connections between the first source-drain electrode layer 20 and other layered structure, a second through hole 31 may be defined in the passivation layer 30 when fabricating the passivation layer 30. It should be noted that in the related art, two small-sized through holes are defined in a passivation layer, so that the passivation layer forms three independent PVX structures (as shown by a dashed line in FIG. 3) on the first source-drain electrode layer 20. In the embodiment of the present disclosure, the second through hole 31 is a large-sized through hole, which is equivalent to etching away a middle part of the passivation layer (i.e., an independent PVX structure in the middle) shown in FIG. 3, so that a part of the first source-drain electrode layer 20 exposed through the second through hole 31 is a relatively continuous and flat surface, which helps to make the second source-drain layer have a relatively continuous and flat surface when fabricating the second source-drain electrode layer 40. Further, when fabricating the dielectric layer 50 and etching the dielectric layer 50 to form the first through hole 51, a position of the first through hole 51 is corresponding to a position of the second through hole 31, and sizes of the second through hole 31 and the first through hole 51 are similar or a size of the second through hole 31 is slightly larger than a size of the first through hole 51.

According to the foregoing first implementation of this embodiment, when etching the passivation layer 30, a larger second through hole 31 is directly etched in the passivation layer 30, thereby adjusting layered structure of the display panel. As a result, the surface of the second source-drain electrode layer 40 is flat, which can prevent damage to the second source-drain electrode layer 40 caused by etching the dielectric layer 50, thereby reducing the breaking risk of the touch electrode line 3 when the touch electrode line 3 is bent, and then further improving the yield of touch products.

Figure 5:
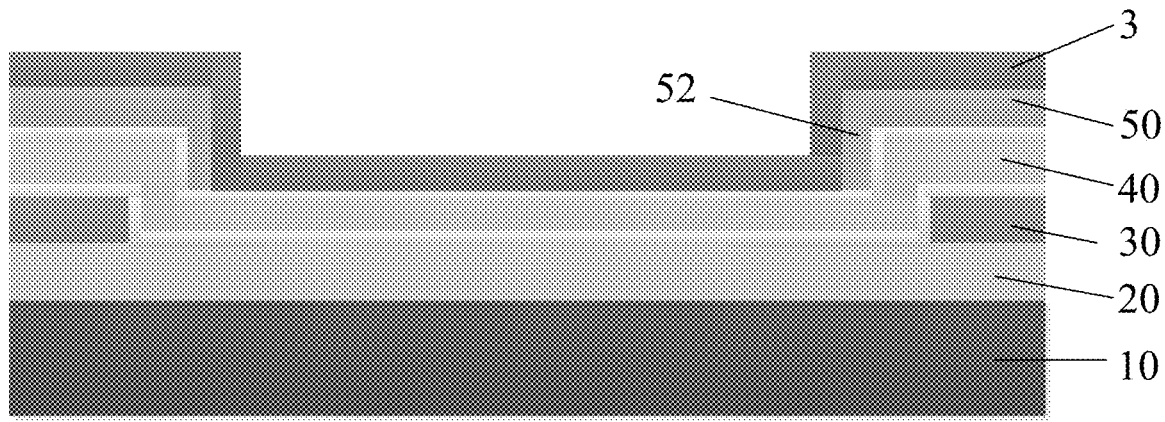
FIG. 5 shows a cross-sectional view of a second layered structure of a display panel in some embodiments of the present disclosure.

FIG. 5 shows a cross-sectional view of a second layered structure of the display panel in the embodiment. On the basis of FIG. 4, when etching the dielectric layer 50 to form the first through hole 51, the dielectric layer 50 may extend to and along a sidewall of the first through hole 51, that is, an extension portion 52 of the dielectric layer 50 is in contact with a lateral surface of the second source-drain layer 40 away from the passivation layer 30, thereby protecting a side wall of the second source-drain electrode layer 40 (i.e., a connection portion between the surface of the second source-drain electrode layer 40 and a protrusion formed by the second source-drain electrode layer 40 due to the passivation layer 30). This can further reduce influence of etching the dielectric layer 50 on the side wall of the second source-drain electrode layer 40, thereby effectively avoiding the breaking of the touch electrode line 3. It should be noted that the extension portion 52 shown in FIG. 5 is a vertical extension portion, but in an actual fabrication, the extension portion 52 may be a slope wall with an inclined angle. One part of the extension portion 52 closer to a bottom of the side wall is wider than another part of the extension portion 52 which is far away from the bottom of the side wall as compared with the one part of the extension portion 52. This can further protect the side wall of the second source-drain electrode layer 40.

Figure 6:
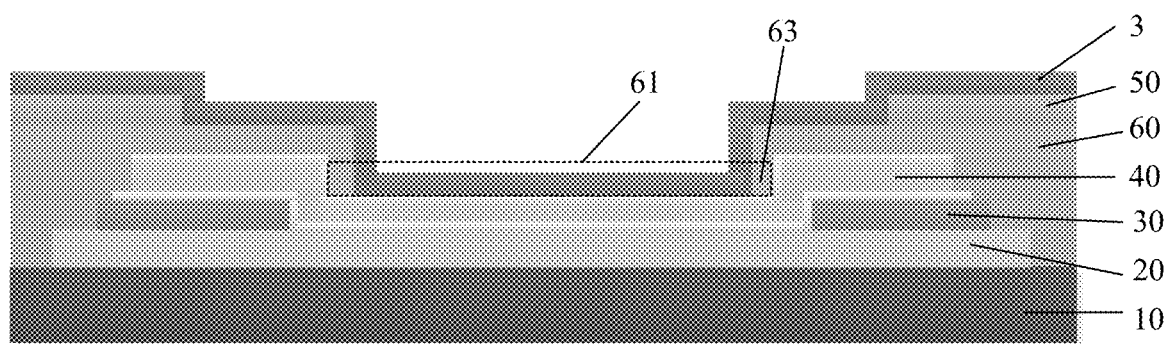
FIG. 6 shows a cross-sectional view of a third layered structure of a display panel in some embodiments of the present disclosure.

FIG. 6 shows a cross-sectional view of a third layered structure of the display panel in the embodiment. On the basis of FIG. 4, a planarization layer 60 is further provided between the dielectric layer 50 and the back plate 10. The planarization layer 60 is mainly used to protect all circuits of the display panel, and thus is actually thicker. The planarization layer 60 packages multiple layers of the display panel, such as the first source-drain electrode layer 20, the passivation layer 30 and the second source-drain electrode layer 40, thereby reducing an interference of circuit magnetic fields between various layers or other structures of the display panel. In the embodiment, the planarization layer 60 may further be used to protect the second source-drain electrode layer 40. Specifically, a third through hole 61 is defined in the planarization layer 60 at a position corresponding to a position of the second through hole 31. A specific size of the third through hole 61 may be slightly smaller than that of the second through hole 31. Meanwhile, when etching the planarization layer 60 to form the third through hole 61, the planarization layer 60 may extend to and along a sidewall of the third through hole 61, so that an extension portion 63 of the planarization layer 60 is in contact with a lateral surface of the second source-drain layer 40 away from the passivation layer 30. The extension portion 63 can further protect the side wall of the second source-drain electrode layer 40, which can further reduce influence of etching the dielectric layer 50 on the side wall of the second source-drain electrode layer 40, thereby effectively avoiding the breaking of the touch electrode line 3. During the fabrication of the display panel, the planarization layer 60 and the third through hole 61 are first fabricated, and then the dielectric layer 50 and the first through hole 51 are fabricated. Since the planarization layer 60 has already protected the side wall of the second source-drain electrode layer 40, the first through hole may be etched larger when etching the dielectric layer 50 to form the first through hole 51. At this point, the touch electrode line 3 extends through the first through hole 51 and the third through hole 61 and then is in contact with the second source-drain electrode layer 40.

It should be noted that the back plate 10 shown in various drawings of the embodiment actually refers to an intermediate product of the display substrate, which is obtained by performing front-end process on a back plate and which may include the back plate 10 and other film layers that need to be fabricated before fabrication of the touch electrodes. The other film layers may include multiple organic layers and inorganic layers, and may further include driving circuit structures such as thin film transistors (TFTs). In order to facilitate observation, these structures are not shown in the drawings.

Figure 7:
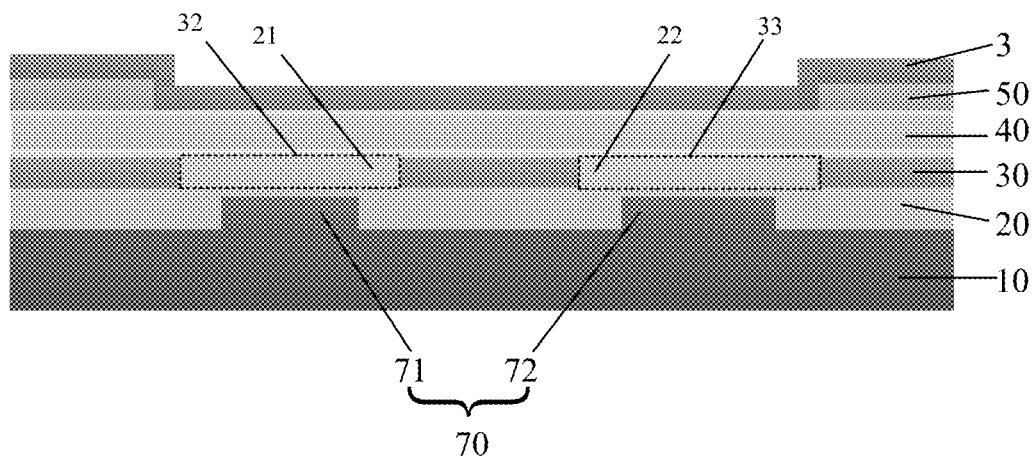
FIG. 7 shows a cross-sectional view of a fourth layered structure of a display panel in some embodiments of the present disclosure.

FIG. 7 shows a cross-sectional view of a fourth layered structure of a display panel in some embodiments of the present disclosure. In this embodiment, a flattening layer 70 having the same or similar thickness as the passivation layer 30 is provided to solve the problem of unevenness of the second source-drain layer 40 caused by etching the passivation layer 30 to form the through hole, which is different from the foregoing embodiments. In the foregoing embodiments, the solutions shown in FIG. 4 to FIG. 6 is to adjust an actual structure of the passivation layer 30 to enable the second source-drain electrode layer 40 be flat, thereby reducing damage to the second source-drain electrode layer 40 caused by etching the dielectric layer 50.

Specifically, an independent first flattening layer 71 and an independent second flattening layer 72 are provided on a surface (taking an upper surface of the back plate as an example in FIG. 7) of the back plate 10. A vertical distance between an upper surface of the first flattening layer 71 and the back plate 10 is equal to a vertical distance between an upper surface of the second flattening layer 72 and the back plate 10. In other words, a thicknesses of the first flattening layer 71 is equal to a thickness of the second flattening layer 72. In order to facilitate subsequent fabrication and structural stability of the layered structure, there is a certain distance between the first flattening layer 71 and the second flattening layer 72, and an actual size of the distance may be determined according to a size of the display panel.

After the first flattening layer 71 and the second flattening layer 72 are formed, the first source-drain electrode layer 20 is provided on the first flattening layer 71 and the second flattening layer 72. Since the first flattening layer 71 and the second flattening layer 72 have a certain height, the first source-drain electrode layer 20 forms a first protrusion 21 at a position corresponding to the first flattening layer 71 and a second protrusion at a position corresponding to the second flattening layer 72. Subsequently, when fabricating the passivation layer 30, a thickness of the passivation layer 30 is the same as or similar to a height of the first protrusion, thereby ensuring flatness of the upper surface of the second source-drain electrode layer 40. In other words, a vertical distance from an upper surface of the passivation layer 30 to the first source-drain electrode layer 20 is the same as a vertical distance from an upper surface of the first flattening layer 71 to the back plate 10. Further, in order to realize connections between the first source-drain electrode layer 20 and other layered structures, a fourth through hole 32 and a fifth through hole 33 are defined in the passivation layer 30. A position of the fourth through hole 32 is corresponding to the first protrusion 21, and the first protrusion 21 extends through the fourth through hole 32. A position of the fifth through hole 33 is correspond to the second protrusion 22, and the second protrusion 22 extends through the fifth through hole 33. In this way, other layered structure is easily connected with the first source-drain electrode layer 20 through the first protrusion 21 and the second protrusion 22. In fact, since the first protrusion 21 and the second protrusion 22 have been formed before fabrication of the passivation layer 30, the fourth through hole 32 and the fifth through hole 33 are formed after formation of the passivation layer 30. For example, after formation of a passivation layer which covers the first protrusion 21 and the second protrusion 22, portions of the passivation layer corresponding to positions of the first protrusion 21 and the second protrusion 22 are etched, until the first protrusion 21 and the second protrusion 22 are exposed through a surface of the passivation layer 30.

After fabrication of the passivation layer 30 and etching the passivation layer 30, an intermediate product of the display structure has a complete plane defined by the passivation layer 30, the first protrusion 21 and the second protrusion 22. Then, when fabricating the second source-drain layer 40, a layered structure with a flat surface may be directly formed, and may directly contact the first protrusion 21 and the second protrusion 22 of the first source-drain electrode layer 20. Finally, the dielectric layer 50 is formed on the second source-drain electrode layer 40, and the first through hole 51 is defined in the dielectric layer 50. A portion of a surface of the second source-drain electrode layer, which is away from the passivation layer 30 and exposed through the first through hole 51, is a flat surface, which facilitates the connection of the touch electrode line 3 and the second source-drain layer 40, and reduces a breaking risk of the touch electrode line 3 when the touch electrode line 3 is bent.

In this embodiment, the flattening layer 70 having the same or similar thickness as the passivation layer 30 is provided to achieve a flatness of the second source-drain source layer 40, which can prevent damage to the second source-drain electrode layer 40 caused by etching the dielectric layer 50, thereby reducing the breaking risk of the touch electrode line 3 when the touch electrode line 3 is bent, and then further improving the yield of touch products.

Figure 8:
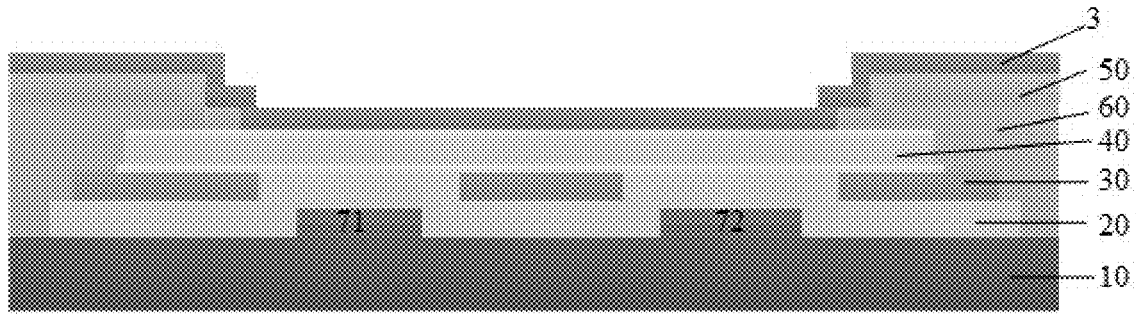
FIG. 8 shows a cross-sectional view of a fifth layered structure of a display panel in some embodiments of the present disclosure.

Similar to the foregoing embodiment, in this embodiment, a planarization layer 60 may further be provided between the dielectric layer 50 and the back plate 10, and is used to protect layers. At this point, a schematic cross-sectional diagram of the display structure is shown in FIG. 8. That is, after fabrication of the second source-drain electrode layer 40, a planarization layer is fabricated and a sixth through hole 62 is etched in the planarization layer so that the second source-drain electrode layer 40 has an exposed flat surface. On the basis, the dielectric layer 50 and the first through hole 51 are fabricated, so that the touch electrode line 3 extends through the first through hole 51 and the sixth through hole 62 to connect with the second source-drain source layer 40. It should be noted that a position of the first through hole 51 is corresponding to a position of the sixth through hole 62, and a size of the first through hole 51 may be the same as a size of the sixth through hole 62, or appropriately smaller than the size of the sixth through hole 62. The dielectric layer 50 extends to and along a sidewall of the sixth through hole 62, thereby further protecting the second source-drain electrode layer 40.

A display device is further provided in some embodiments of the present disclosure. The display device includes any display panel described in the foregoing embodiments of the present disclosure. Since the technical solutions of this embodiment include all the technical solutions of the foregoing display panel, at least all the foregoing technical effects can be achieved, which will not be repeated here.

Figure 9:
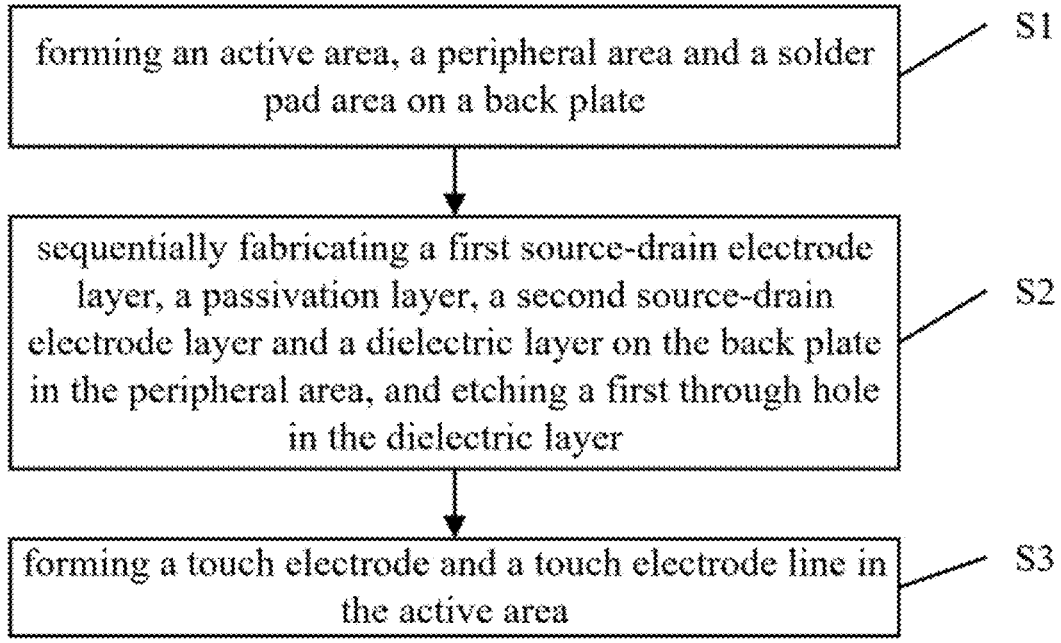
FIG. 9 shows a flowchart of a method of manufacturing display panels in some embodiments of the present disclosure.

A method for manufacturing display panels is provided in some embodiments of the present disclosure provide. The method is mainly used to manufacture the display panel of the embodiments of the present disclosure shown in FIGS. 4 to 6. A flowchart of the method is shown in FIG. 9. The method mainly includes steps S1 to S3.

S1: forming an active area, a peripheral area and a solder pad area on a back plate, where the peripheral area surrounds the active area and the solder pad area is located at a side of the peripheral area away from the active area.

S2: sequentially fabricating a first source-drain electrode layer, a passivation layer, a second source-drain electrode layer and a dielectric layer on the back plate in the peripheral area, and etching a first through hole in the dielectric layer, where a portion of a surface of the second source-drain electrode layer, which is away from the passivation layer and exposed through the first through hole, is a flat surface.

S3: forming a touch electrode and a touch electrode line in the active area; where the touch electrode line is electrically connected to the touch electrode, the touch electrode line extends from the active area to the peripheral area and is connected to the solder pad area through the second source-drain electrode layer in the peripheral area, and the touch electrode line is connected to the second source-drain electrode layer through the first through hole.

Fabrication of the display panel provided in the embodiments of the present disclosure as shown in FIGS. 4 to 6 will be described hereinafter in detail with reference to FIGS. 10 to 13. It should be noted that all methods of manufacturing display panels in the embodiment (such as evaporation, etching) may directly use related technologies in the related art, and details of specific manufacturing methods are not described here.

Figure 10:
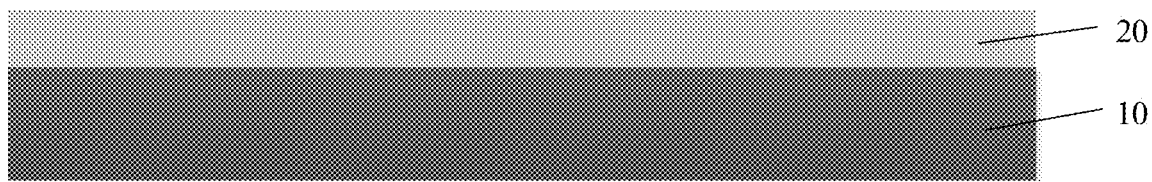
FIG. 10 shows a schematic diagram of a layered structure after performing a step S31 of the method in some embodiments of the present disclosure.

S31: forming a first source-drain electrode layer 20 on a surface of a back plate 10, with an intermediate product as shown in FIG. 10.

Figure 11:
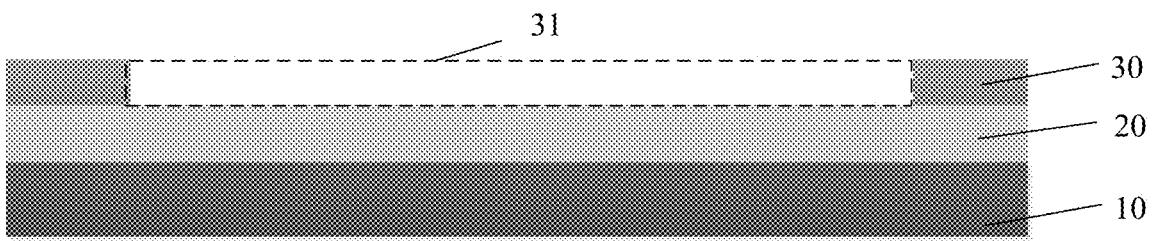
FIG. 11 shows a schematic diagram of a layered structure after performing a step S32 of the method in some embodiments of the present disclosure.

S32: forming a passivation layer 30 on a surface of the first source-drain electrode layer 20 away from the back plate, and etching the passivation layer 30 to form a second through hole 31, as shown in FIG. 11. It should be noted that in the related art, two small-sized through holes are defined in a passivation layer, so that the passivation layer forms three independent PVX structures (as shown by a dashed line in FIG. 3) on the first source-drain electrode layer. In the embodiment of the present disclosure, the second through hole 31 is a large-sized through hole, which is equivalent to etching away a middle part of the passivation layer shown in FIG. 3, so that a part of the first source-drain electrode layer 20 exposed through the second through hole 31 is a relatively continuous and flat surface, which helps to make the second source-drain layer have a relatively continuous and flat surface when fabricating the second source-drain electrode layer. As shown in FIG. 11, the second through hole 31 is a part marked by a dashed frame.

Figure 12:
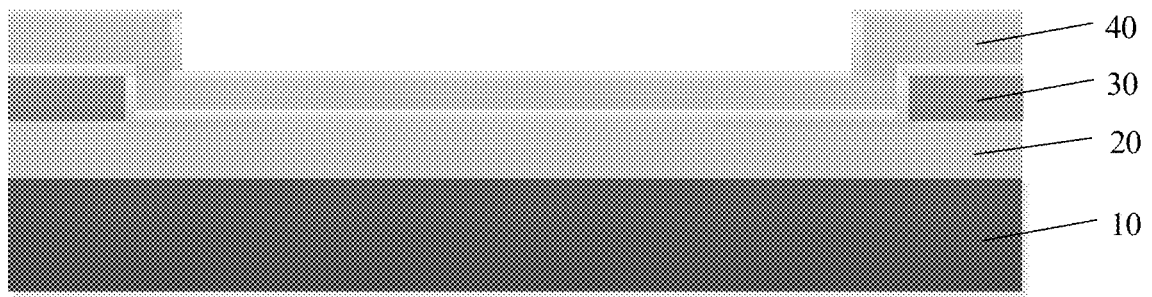
FIG. 12 shows a schematic diagram of a layered structure after performing a step S33 of the method in some embodiments of the present disclosure.

S33: forming a second source-drain electrode layer 40 on a surface of the passivation layer 30 away from the first source-drain electrode layer 20, with the second source-drain electrode layer 40 in contact with the first source-drain electrode layer through the second through hole 31. At this point, an intermediate product as shown in FIG. 12.

Figure 13:
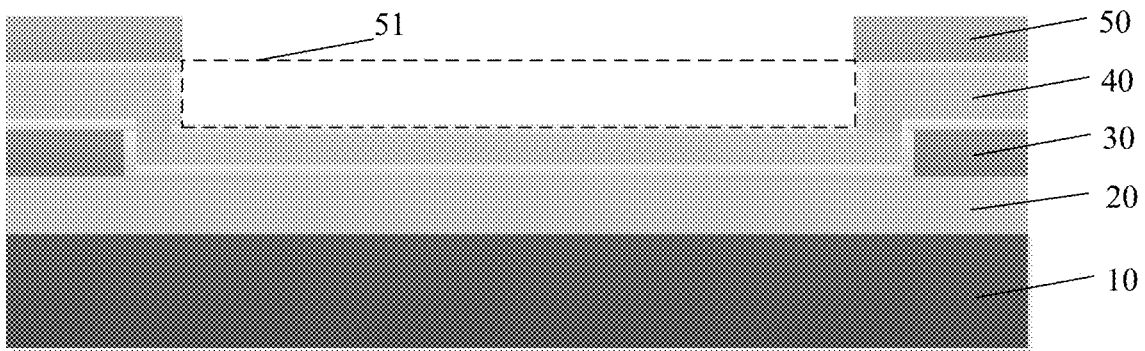
FIG. 13 shows a schematic diagram of a layered structure after performing a step S34 of the method in some embodiments of the present disclosure.

S34: forming a dielectric layer 50 on a surface of the second source-drain electrode layer 40 away from the passivation layer 30, and etching the dielectric layer 50 to form a first through hole 51. A position of the first through hole 51 is corresponding to a position of the second through hole 31, and a size of the second through hole 31 is slightly larger than a size of the first through hole 51, to ensure that a relatively flat surface of the second source-drain electrode layer is exposed for connection. This reduces a risk that the side wall of the uneven second source-drain electrode layer in FIG. 3 may be damaged when etching the dielectric layer, and then ensures connection effect. As shown in FIG. 13, the first through hole 51 is a part marked by a dashed frame.

S35: forming a touch electrode line 3 on a surface of the dielectric layer 50 away from the second source-drain electrode layer 40, with a final manufactured display panel shown in FIG. 4.

According to the foregoing first implementation of this embodiment, when etching the passivation layer, a larger second through hole is directly etched in the passivation layer, thereby adjusting layered structure of the display panel. As a result, the surface of the second source-drain electrode layer is flat, which can prevent damage to the second source-drain electrode layer caused by etching the dielectric layer 50, thereby reducing the breaking risk of the touch electrode line when the touch electrode line is bent, and then further improving the yield of touch products.

Figure 14:
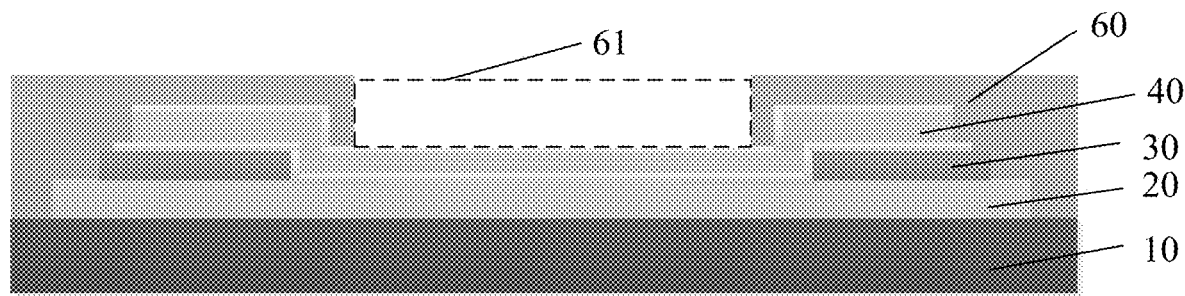
FIG. 14 shows a schematic diagram of a layered structure after forming a planarization layer and before performing a step S34 of the method in some embodiments of the present disclosure.

In addition, when performing the step S34, an etching degree of the dielectric layer may be controlled so that the dielectric layer extends to a side wall of the first through hole and contacts an upper surface of the second source-drain electrode layer, thereby further reducing influence on the second source-drain electrode layer when etching the dielectric layer, and effectively avoiding a breaking of the touch electrode line. In addition, before performing the step 34, a planarization layer 60 may further be formed on a surface of the second source-drain electrode layer 40 away from the passivation layer 30. A third through hole 61 is etched in the planarization layer 60 at a position corresponding to the second through hole 31. When etching the third through hole 61 in the planarization layer 60, the planarization layer 60 may extend to a side wall of the third through hole 61, and is in contact with a surface of the second source-drain layer 40, thereby further reducing influence of etching the dielectric layer 50 on the side wall of the second source-drain electrode layer 40 and effectively avoiding the breaking of the touch electrode line. As shown in FIG. 14, the third through hole 61 is a part marked by a dashed frame. Subsequent fabrication may be performed based on the steps S34 and S35, and a finally manufactured display panel is shown in FIG. 6, which will not be described in detail here.

A method for manufacturing display panels is provided in some embodiments of the present disclosure provide. The method is mainly used to manufacture the display panel of the embodiments of the present disclosure shown in FIGS. 7 to 8. Fabrication of the display panel provided in the embodiments of the present disclosure as shown in FIGS. 7 to 8 will be described hereinafter in detail with reference to FIGS. 14 to 19. It should be noted that all methods of manufacturing display panels in the embodiment (such as evaporation, etching) may directly use related technologies in the related art, and details of specific manufacturing methods are not described here.

Figure 15:
FIG. 15 shows a schematic diagram of a layered structure after performing a step S41 of the method in some embodiments of the present disclosure.

S41: forming a first flattening layer 71 and a second flattening layer 72 on a surface of a back plate 10; where a vertical distance between an upper surface of the first flattening layer 71 and the back plate 10 is equal to a vertical distance between an upper surface of the second flattening layer 72 and the back plate 10, as shown in FIG. 15.

Figure 16:
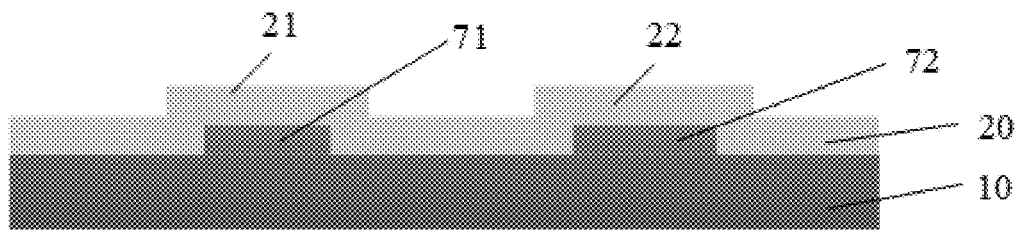
FIG. 16 shows a schematic diagram of a layered structure after performing a step S42 of the method in some embodiments of the present disclosure.

S42: forming a first source-drain electrode layer 20 on the first flattening layer 71 and the second flattening layer 72, so that the first source-drain electrode layer 20 forms a first protrusion 21 at a position corresponding to the first flattening layer 71 and a second protrusion at a position corresponding to the second flattening layer 72. An intermediate product is shown in FIG. 16.

Figure 17:
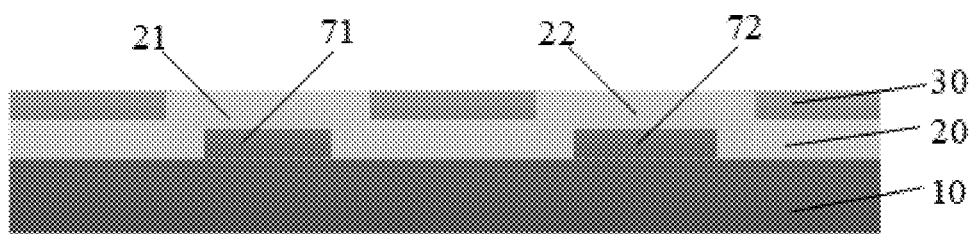
FIG. 17 shows a schematic diagram of a layered structure after performing a step S43 of the method in some embodiments of the present disclosure.

S43: forming a passivation layer 30 on a surface of the first source-drain electrode layer 20 away from the back plate 10 with a thickness of the passivation layer 30 equal to a thickness of the first protrusion 21, and etching the passivation layer 30 to form a fourth through hole 32 and a fifth through hole 33, so that the first protrusion 21 extends through the fourth through hole 32 and the second protrusion 22 extends through the fifth through hole 33. In fact, since the first protrusion 21 and the second protrusion 22 have been formed before fabrication of the passivation layer 30, the fourth through hole 32 and the fifth through hole 33 are formed after formation of the passivation layer 30. For example, after formation of a passivation layer which covers the first protrusion 21 and the second protrusion 22, portions of the passivation layer corresponding to positions of the first protrusion 21 and the second protrusion 22 are etched, until the first protrusion 21 and the second protrusion 22 are exposed through a surface of the passivation layer 30, as shown in FIG. 17.

Figure 18:
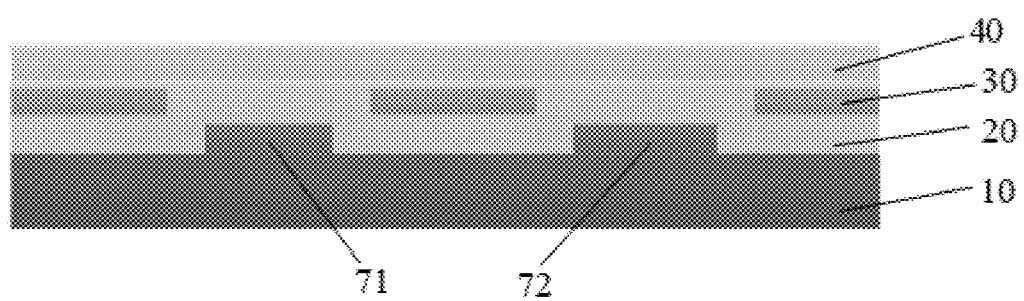
FIG. 18 shows a schematic diagram of a layered structure after performing a step S44 of the method in some embodiments of the present disclosure.
Figure 19:
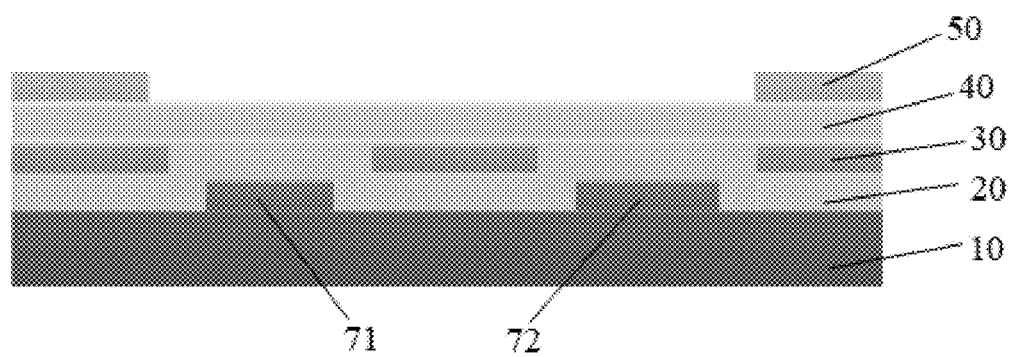
FIG. 19 shows a schematic diagram of a layered structure after performing a step S45 of the method in some embodiments of the present disclosure.

S44: forming a second source-drain electrode layer 40 on a surface of the passivation layer 30 away from the first source-drain electrode layer 20. The second source-drain electrode layer 40 is in contact with the first protrusion 21 and the second protrusion 22. At this point, an intermediate product is shown in FIG. 18.

S45: forming a dielectric layer 50 on a surface of the second source-drain electrode layer 40 away from the passivation layer 30, and etching the dielectric layer 50 to form a first through hole 51. It should be noted that a size of the first through hole 51 may be etched as large as possible while satisfying connection conditions, so as to increase the contact area between the touch electrode line and the second source-drain electrode layer, thereby effectively avoiding a breaking of the touch electrode line, as shown in FIG. 9.

S46: forming a touch electrode line 3 on a surface of the dielectric layer 50 away from the second source-drain electrode layer 40, with the touch electrode line 3 in contact with the second source-drain electrode layer 40 through the first through hole 51. A final manufactured display panel is shown in FIG. 4.

In this embodiment, the flattening layer having the same or similar thickness as the passivation layer is provided to achieve a flatness of the second source-drain source layer, which can prevent damage to the second source-drain electrode layer caused by etching the dielectric layer, thereby reducing the breaking risk of the touch electrode line when the touch electrode line is bent, and then further improving the yield of touch products.

In some embodiments, a planarization layer may be further provided between the dielectric layer and the back plate, and is used to protect layers. A final manufactured structure is shown in FIG. 8, and which will not be repeated here.

The above are merely the embodiments of the present disclosure and shall not be used to limit the scope of the present disclosure. It should be noted that, a person skilled in the art may make improvements and modifications without departing from the principle of the present disclosure, and these improvements and modifications shall also fall within the scope of the present disclosure. The protection scope of the present disclosure shall be subject to the protection scope of the claims.

What is claimed is:

1. A display panel, comprising:
    an active area;
    a peripheral area surrounding the active area;
    a solder pad area at a side of the peripheral area away from the active area;
    a back plate;

a first source-drain electrode layer, a passivation layer and a second source-drain electrode layer and a dielectric layer sequentially stacked on the back plate and located in the peripheral area;

a touch electrode in the active area; and a touch electrode line electrically connected to the touch electrode;

wherein the touch electrode line extends from the active area to the peripheral area, and is connected to the solder pad area through the second source-drain electrode layer in the peripheral area;

wherein the touch electrode line is connected to the second source-drain electrode layer through a first through hole in the dielectric layer; and a portion of a surface of the second source-drain electrode layer, which is away from the passivation layer and exposed through the first through hole, is a flat surface;

wherein the display panel further includes a first flattening layer and a second flattening layer between the back plate and the first source-drain electrode layer;

wherein a vertical distance between the back plate and a surface of the first flattening layer away from the back plate is equal to a vertical distance between the back plate and a surface of the second flattening layer away from the back plate;

the first source-drain electrode layer forms a first protrusion at a position corresponding to the first flattening layer and a second protrusion at a position corresponding to the second flattening layer;

a fourth through hole and a fifth through hole are defined in the passivation layer; the first protrusion extends through the fourth through hole; the second protrusion extends through the fifth through hole;

a vertical distance between a surface of the passivation layer away from the back plate and the first source-drain electrode layer is equal to the vertical distance between the back plate and the surface of the first flattening layer away from the back plate;

the second source-drain electrode layer is in contact with the first protrusion and the second protrusion.

2. The display panel according to claim 1, wherein a second through hole is defined in the passivation layer; the second source-drain electrode layer is connected to the first source-drain electrode layer through the second through hole; a position of the first through hole in the dielectric layer is corresponding to a position of the second through hole.

3. The display panel according to claim 2, wherein the dielectric layer extends to a side wall that defines the first through hole, and is in contact with a lateral surface of the second source-drain electrode layer away from the passivation layer.

4. The display panel according to claim 2, further comprising:

a planarization layer between the dielectric layer and the back plate;

wherein a third through hole is defined in the planarization layer at a position corresponding to the position of the second through hole; the planarization layer extends to a side wall that defines the third through hole and is in contact with the surface of the second source-drain electrode layer away from the passivation layer;

the touch electrode line extends through the first through hole and the third through hole and is in contact with the second source-drain electrode layer.

5. The display panel according to claim 1, further comprising:

a planarization layer between the dielectric layer and the back plate;

wherein a sixth through hole is defined in the planarization layer at a position corresponding to a position of the first through hole; and the touch electrode line is connected to the second source-drain electrode layer through the first through hole as well as the sixth through hole.

6. The display panel according to claim 1, wherein the second source-drain electrode layer is in direct contact with the first protrusion and the second protrusion.

7. A display device, comprising a display panel;

wherein the display panel includes:

an active area;

a peripheral area surrounding the active area;

a solder pad area at a side of the peripheral area away from the active area;

a back plate;

a first source-drain electrode layer, a passivation layer and a second source-drain electrode layer and a dielectric layer sequentially stacked on the back plate and located in the peripheral area;

a touch electrode in the active area; and a touch electrode line electrically connected to the touch electrode;

wherein the touch electrode line extends from the active area to the peripheral area, and is connected to the solder pad area through the second source-drain electrode layer in the peripheral area;

wherein the touch electrode line is connected to the second source-drain electrode layer through a first through hole in the dielectric layer; and a portion of a surface of the second source-drain electrode layer, which is away from the passivation layer and exposed through the first through hole, is a flat surface;

wherein the display panel further includes: a first flattening layer and a second flattening layer between the back plate and the first source-drain electrode layer;

wherein a vertical distance between the back plate and a surface of the first flattening layer away from the back plate is equal to a vertical distance between the back plate and a surface of the second flattening layer away from the back plate;

the first source-drain electrode layer forms a first protrusion at a position corresponding to the first flattening layer and a second protrusion at a position corresponding to the second flattening layer;

a fourth through hole and a fifth through hole are defined in the passivation layer; the first protrusion extends through the fourth through hole; the second protrusion extends through the fifth through hole;

a vertical distance between a surface of the passivation layer away from the back plate and the first source-drain electrode layer is equal to the vertical distance between the back plate and the surface of the first flattening layer away from the back plate;

the second source-drain electrode layer is in contact with the first protrusion and the second protrusion.

8. The display device according to claim 7, wherein a second through hole is defined in the passivation layer; the second source-drain electrode layer is connected to the first source-drain electrode layer through the second through hole; a position of the first through hole in the dielectric layer is corresponding to a position of the second through hole.

9. The display device according to claim 8, wherein the dielectric layer extends to a side wall that defines the first through hole, and is in contact with a lateral surface of the second source-drain electrode layer away from the passivation layer.

10. The display device according to claim 8, wherein the display panel further includes:
    a planarization layer between the dielectric layer and the back plate;
    wherein a third through hole is defined in the planarization layer at a position corresponding to the position of the second through hole; the planarization layer extends to a side wall that defines the third through hole and is in contact with the surface of the second source-drain electrode layer away from the passivation layer;
    the touch electrode line extends through the first through hole and the third through hole and is in contact with the second source-drain electrode layer.

11. The display device according to claim 7, wherein the display panel further includes: a planarization layer between the dielectric layer and the back plate;
    wherein a sixth through hole is defined in the planarization layer at a position corresponding to a position of the first through hole; and
    the touch electrode line is connected to the second source-drain electrode layer through the first through hole as well as the sixth through hole.

12. The display device according to claim 7, wherein the second source-drain electrode layer is in direct contact with the first protrusion and the second protrusion.

13. A method for manufacturing a display panel, comprising:
    forming an active area, a peripheral area and a solder pad area on a back plate; wherein the peripheral area surrounds the active area and the solder pad area is located at a side of the peripheral area away from the active area;
    sequentially fabricating a first source-drain electrode layer, a passivation layer, a second source-drain electrode layer and a dielectric layer on the back plate in the peripheral area, and etching a first through hole in the dielectric layer; wherein a portion of a surface of the second source-drain electrode layer, which is away from the passivation layer and exposed through the first through hole, is a flat surface;
    forming a touch electrode and a touch electrode line in the active area; wherein the touch electrode line is electrically connected to the touch electrode, the touch electrode line extends from the active area to the peripheral area and is connected to the solder pad area through the second source-drain electrode layer in the peripheral area, and the touch electrode line is connected to the second source-drain electrode layer through the first through hole;
    wherein before fabricating the first source-drain electrode layer, the method further includes: forming a first flattening layer and a second flattening layer on the back plate; wherein a vertical distance between the back plate and a surface of the first flattening layer away from the back plate is equal to a vertical distance between the back plate and a surface of the second flattening layer away from the back plate;
    when fabricating the passivation layer, the method further includes:
    etching the passivation layer to form a fourth through hole and a fifth through hole; wherein the first protrusion extends through the fourth through hole; the second protrusion extends through the fifth through hole; a vertical distance between a surface of the passivation layer away from the back plate and the first source-drain electrode layer is equal to the vertical distance between the back plate and the surface of the first flattening layer away from the back plate.

14. The method according to claim 11, wherein before fabricating the second source-drain electrode layer, the method further includes: etching the passivation layer to form a second through hole.

\* \* \* \* \*